(12) United States Patent
Wang et al.

(10) Patent No.: US 12,222,381 B2
(45) Date of Patent: Feb. 11, 2025

(54) THIN FILM SENSOR AND MANUFACTURING METHOD THEREOF

(71) Applicant: BOE TECHNOLOGY GROUP CO., LTD., Beijing (CN)

(72) Inventors: Feng Wang, Beijing (CN); Jian Zhou, Beijing (CN); Yanzhao Li, Beijing (CN); Feng Qu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/637,908

(22) PCT Filed: Mar. 23, 2021

(86) PCT No.: PCT/CN2021/082275
§ 371 (c)(1),
(2) Date: Feb. 24, 2022

(87) PCT Pub. No.: WO2022/198431
PCT Pub. Date: Sep. 29, 2022

(65) Prior Publication Data
US 2024/0094274 A1    Mar. 21, 2024

(51) Int. Cl.
*G01R 29/08* (2006.01)
(52) U.S. Cl.
CPC ................ *G01R 29/0885* (2013.01)
(58) Field of Classification Search
CPC ............ G01R 29/0885; G01R 33/0035; G01R 33/0017; G01R 33/34061; G01B 7/004; G01C 17/38; G06F 3/017; G06F 3/0346; G06F 3/012; A61B 34/20; A61B 2034/2051; G02B 27/017
See application file for complete search history.

(56) References Cited

U.S. PATENT DOCUMENTS

| | | | |
|---|---|---|---|
| 2016/0133424 A1 | 5/2016 | Chou et al. | |
| 2020/0050031 A1* | 2/2020 | Lu ...................... | G02F 1/0322 |

(Continued)

FOREIGN PATENT DOCUMENTS

| | | |
|---|---|---|
| CN | 104614077 A | 5/2015 |
| CN | 110045874 A | 7/2019 |

(Continued)

*Primary Examiner* — Jermele M Hollington
*Assistant Examiner* — Taqi R Nasir
(74) *Attorney, Agent, or Firm* — HOUTTEMAN LAW LLC

(57) ABSTRACT

The present disclosure provides a thin film sensor and a manufacturing method thereof, and belongs to the technical field of sensors. The thin film sensor of the present disclosure has a plurality of conductive-wire regions intersecting each other, and a plurality of hollow-out parts defined by the plurality of conductive-wire regions; the thin film sensor includes: a base substrate; a plurality of conductive wires on the base substrate, with the conductive wires being in the conductive-wire regions one to one; and a functional structure on the base substrate, where the functional structure is configured to allow at least part of light, which is transmitted along a preset direction and enters the functional structure from the conductive wire-regions, to exit from the hollow-out parts, and the preset direction is a direction from the base substrate towards the conductive wires.

18 Claims, 7 Drawing Sheets

(56) References Cited

U.S. PATENT DOCUMENTS

| | | | |
|---|---|---|---|
| 2020/0064195 A1 | 2/2020 | Gallinet et al. | |
| 2021/0055456 A1* | 2/2021 | Uenoyama | C03C 17/00 |
| 2022/0102851 A1* | 3/2022 | Wang | H01Q 1/38 |

FOREIGN PATENT DOCUMENTS

| | | | | |
|---|---|---|---|---|
| CN | 110348100 A | | 10/2019 | |
| CN | 110865431 A | | 3/2020 | |
| CN | 112164871 A | * | 1/2021 | H01Q 1/36 |
| IN | 104247054 A | | 12/2014 | |
| WO | WO2019216113 A | | 11/2019 | |

\* cited by examiner

THIN FILM SENSOR AND MANUFACTURING METHOD THEREOF

TECHNICAL FIELD

The present disclosure relates to the technical field of sensors, and particularly relates to a thin film sensor and a manufacturing method thereof.

BACKGROUND

With the development of technologies of the Internet of Things and communication technologies, demand for thin film sensors, such as thin film antennas, is gradually increased. In consideration of achieving better integration in living scenarios, transparent antennas are highly favored. For example, the transparent antennas can be integrated with glass of buildings, glass of rail transportation equipment, glass of automobiles and the like, without affecting normal sight, and the transparent antennas such integrated can also help to achieve information transfer, realize the Internet of Things, and make life more convenient.

SUMMARY

The present disclosure aims to solve at least one of the technical problems in the prior art, and provides a thin film sensor and a manufacturing method thereof.

In a first aspect, an embodiment of the present disclosure provides a thin film sensor, including:
 a base substrate,
 a plurality of conductive wires on the base substrate, which intersect each other to define
 a plurality of hollow-out parts; and
 a functional structure on the base substrate; where the functional structure is configured to allow at least part of light, which is transmitted along a preset direction and enters the functional structure from regions where the conductive wires are located, to exit from the hollow-out parts, and the preset direction is a direction from the base substrate towards the conductive wires.

The thin film sensor further includes a planarization layer on a side of the plurality of conductive wires away from the base substrate; the functional structure includes: a first medium layer on a side of the conductive wires close to the base substrate; and a refractive index of the first medium layer is less than that of the planarization layer; and
 the first medium layer includes a plurality of first main portions intersecting each other; and orthographic projections of the first main portions on the base substrate overlap those of the conductive wires on the base substrate respectively.

The functional structure includes: a first medium layer and a second medium layer on the base substrate; and a refractive index of the first medium layer is less than that of the second medium layer;
 the first medium layer is on a side of the conductive wires close to the base substrate; the first medium layer includes a plurality of first main portions intersecting each other; and orthographic projections of the first main portions on the base substrate overlap those of the conductive wires on the base substrate respectively; and
 the second medium layer includes a plurality of first grooves intersecting each other; and the first grooves are filled with the first main portions therein one to one.

The functional structure further includes a first flat part, which is between the conductive wires and the second medium layer and is connected with the plurality of first main portions to be formed into one piece.

The thin film sensor further includes a planarization layer on a side of the plurality of conductive wires away from the base substrate; and a difference between refractive indices of the planarization layer and the second medium layer is not greater than 0.2.

A thickness of each first main portion is at least 1.5 times of a maximum width thereof.

The first main portions are doped with micro-nano scattering particles or micro-nano scattering pores.

Each of the first main portions has a first section perpendicular to an extending direction of the first main portion; each of the first sections has a top edge away from the base substrate and at least one side edge connected with the top edge; and an included angle between a tangent of any point on the side edge and the top edge away from the base substrate is not greater than 90°.

A shape of the first section includes any one of an inverted trapezoid, an inverted triangle, and a semi-ellipse.

The functional structure includes a third medium layer on the base substrate, and a fourth medium layer is between the third medium layer and a layer where the conductive wires are located; and
 the third medium layer includes a plurality of second main portions intersecting each other; and orthographic projections of the second main portions on the base substrate overlap those of the conductive wires on the base substrate one to one.

The second main portions include any one of a metal film, a semi-reflective and semi-transmissive film, and a distributed Bragg reflector.

The thin film sensor further includes a planarization layer on a side of the plurality of conductive wires away from the base substrate; and a difference between refractive indices of the planarization layer and the fourth medium layer is not greater than 0.05.

The thin film sensor further includes reflective sheets on a side of the conductive wires opposite to the second main portions.

In a second aspect, an embodiment of the present disclosure provides a manufacturing method of a thin film sensor, which includes:
 forming a plurality of conductive wires intersecting each other and a functional structure on a base substrate; where the functional structure is configured to allow at least part of light, which is transmitted along a preset direction and enters the functional structure from regions where the conductive wires are located, to exit from hollow-out parts, and the preset direction is a direction from the base substrate towards the conductive wires.

The functional structure includes a first medium layer disposed on the base substrate, the forming the functional structure includes forming the first medium layer on the base substrate, and the forming the first medium layer includes:
 forming a plurality of first main portions intersecting each other on a side of the conductive wires close to the base substrate, with orthographic projections of the first main portions on the base substrate overlapping those of the conductive wires to be formed on the base substrate one to one; and
 the manufacturing method further includes:
 forming a pattern including a planarization layer on a side of the first medium layer away from the base substrate;

and a refractive index of the first medium layer is less than that of the planarization layer.

The functional structure includes: a first medium layer and a second medium layer on the base substrate; a refractive index of the first medium layer is less than that of the second medium layer; and the forming the functional structure includes: forming the second medium layer on a side of the conductive wires close to the base substrate, where a plurality of first grooves intersecting each other are formed in the second medium layer; and forming the first medium layer, which includes a plurality of first main portions intersecting each other, between the second medium layer and the conductive wires; where orthographic projections of the first main portions on the base substrate overlap those of the conductive wires on the base substrate one to one.

DETAIL DESCRIPTION OF EMBODIMENTS

In order to enable those of ordinary skill in the art to better understand the technical solutions of the present disclosure, the present disclosure is further described in detail below with reference to the accompanying drawings and specific embodiments.

Unless otherwise defined, technical terms or scientific terms used herein should have general meanings that are understood by those of ordinary skill in the technical field to which the present disclosure belongs. The words "first", "second" and the like used herein do not denote any order, quantity or importance, but are just used to distinguish between different elements. Similarly, the words "an", "a", "the" and the like do not denote a limitation to quantity, and indicate the existence of "at least one" instead. The words "include", "comprise" and the like indicate that an element or object before the words covers the elements or objects or the equivalents thereof listed after the words, rather than excluding other elements or objects. The words "connect", "couple" and the like are not limited to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

Figure 1:
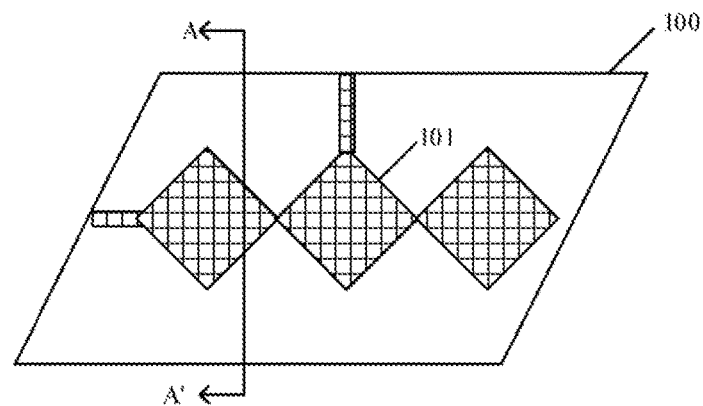
FIG. 1 is a schematic structural diagram of an exemplary thin film sensor.
Figure 2:
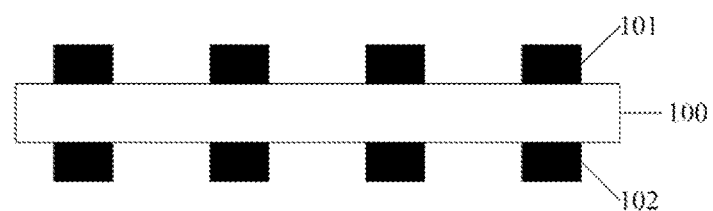
FIG. 2 is a schematic cross-sectional diagram of a structure of the thin film sensor of FIG. 1 taken along A-A' direction.

FIG. 1 is a schematic structural diagram of an exemplary thin film sensor; and FIG. 2 is a schematic cross-sectional diagram of a structure of the thin film sensor shown in FIG. 1 taken along A-A' direction. As shown in FIG. 1 and FIG. 2, the thin film sensor includes: a base substrate 100 having a first surface and a second surface, i.e., an upper surface and a lower surface, which are arranged opposite to each other; and a first conductive layer 101 and a second conductive layer 102, which are located on the first surface and the second surface of the base substrate 100 respectively. Taking a case where the thin film sensor is a transparent antenna as an example, the first conductive layer 101 may be a radiation layer, and the second conductive layer 102 may be a ground layer. The radiation layer may be used as a receiving unit of an antenna structure and may also be used as a transmitting unit of the antenna structure.

In order to ensure that the first conductive layer 101 and the second conductive layer 102 have good light transmittance, the first conductive layer 101 and the second conductive layer 102 need to be patterned, for example, the first conductive layer 101 may be formed by grid lines made of a metal material, and the second conductive layer 102 may also be formed by grid lines made of a metal material. It should be understood that the first conductive layer 101 and the second conductive layer 102 may also be formed into structures having other patterns such as a rhombic block electrode and a triangular block electrode, which are not listed one by one here. As can be seen from FIG. 1, the first conductive layer 101 and the second conductive layer 102, i.e., the grid lines, are not arranged all over the two surfaces of the base substrate 100. Any one of the grid lines is formed by electrically connected metal grids. Due to a material and a manufacturing process of the metal grids, the metal grid has a relatively large line width, which significantly affects the light transmittance of the thin film sensor, and further affects user experience.

It should be noted that the thin film sensor is not limited to be applied to an antenna structure, and can also be used in a touch panel as a touch electrode. The thin film sensor can also be used in various metal wires, which are not listed one by one here.

In order to solve the above technical problem, the embodiments of the present disclosure provide the following technical solutions. Before the thin film sensor provided by the embodiments of the present disclosure is described, it should be noted that a material of the thin film sensor provided by the embodiments of the present disclosure is a conductive material with relatively low transmittance, and the material includes, but is not limited to, a metal, a metal oxide, Graphene and the like, that is, a material of a conductive wire includes, but is not limited to, a metal, a metal oxide, Graphene and the like. The following description is given by taking a case where the conductive wire is a metal wire as an example, but it should be understood that the embodiments of the present disclosure are not limited thereto.

Figure 3:
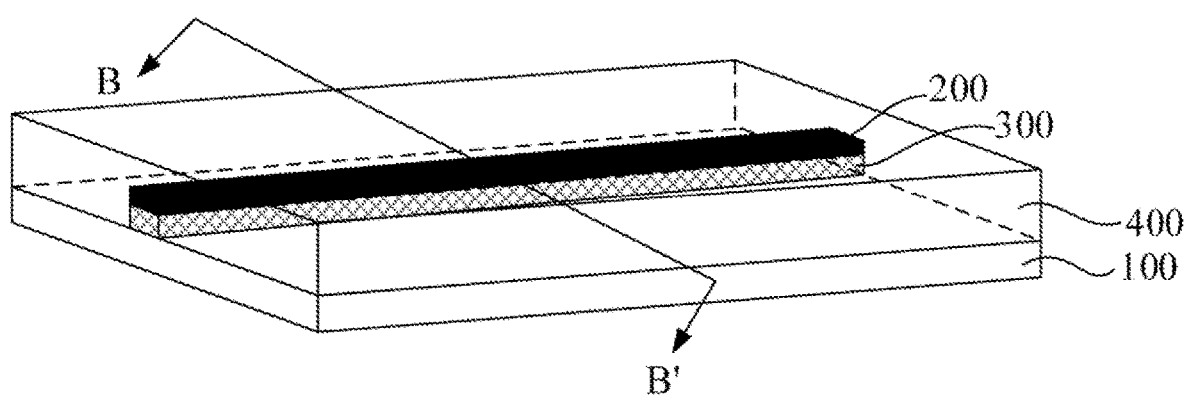
FIG. 3 is a perspective view of a thin film sensor according to an embodiment of the present disclosure.
Figure 4:
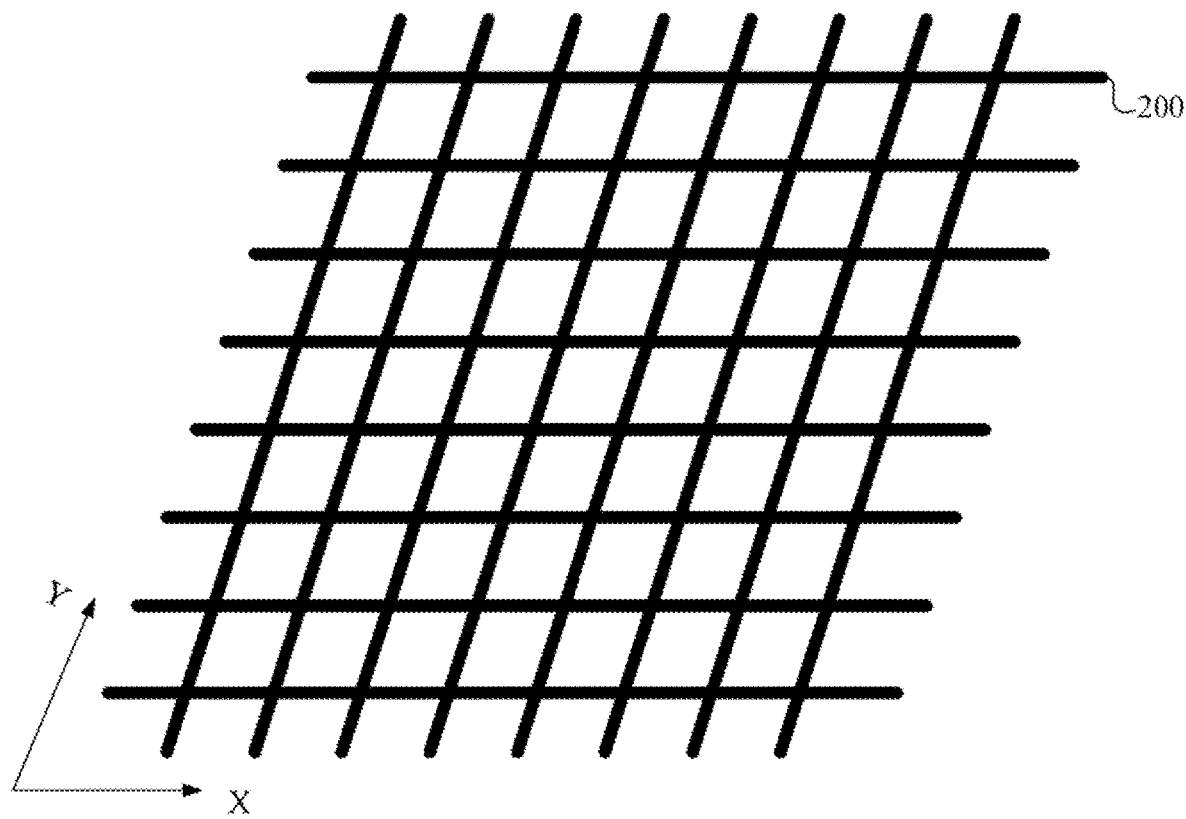
FIG. 4 is a top view of metal wires in a thin film sensor according to an embodiment of the present disclosure.
Figure 5:
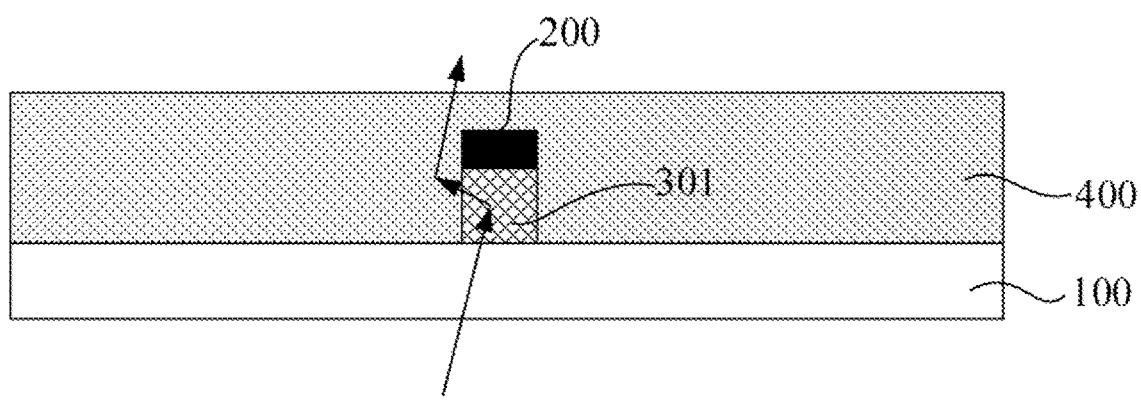
FIG. 5 is a schematic cross-sectional diagram of a structure of the thin film sensor of FIG. 3 taken along B-B' direction.

In a first aspect, FIG. 3 is a perspective view of a thin film sensor according to an embodiment of the present disclosure; FIG. 4 is a top view of a metal wire 200 in a thin film sensor according to an embodiment of the present disclosure; and FIG. 5 is a schematic cross-sectional diagram of a structure of the thin film sensor shown in FIG. 3 taken along B-B' direction. The embodiment of the present disclosure provide a thin film sensor, which may include a base substrate 100, a plurality of metal wires 200 disposed on the base substrate 100 and intersecting one another, and a functional structure. Part of the plurality of metal wires 200 extend along a first direction X and are arranged side by side along a second direction Y, and the remaining metal wires 200 extend along the second direction Y and are arranged side by side along the first direction X. The first direction X intersects the second direction Y, and hollow-out areas defined by the first direction X and the second direction Y correspond to hollow-out parts defined by intersection of the metal wires 200, and a shape of the hollow-out area includes, but is not limited to, a rhombus. In the embodiment of the present disclosure, the functional structure is configured to allow at least part of light, which is transmitted along a preset direction and enters the functional structure from regions where the conductive wires are located, to exit from the hollow-out parts; and the preset direction is a direction from the base substrate 100 towards the metal wires 200.

Since the thin film sensor provided by the embodiment of the present disclosure is provided therein with the functional structure, and the functional structure can allow at least part of the light, which is transmitted along the preset direction and enters the functional structure from the regions where the conductive wires are located, to exit from the hollow-out parts, that is, at least part of light, which is irradiated to the regions where the conductive wires are located, can exit by bypassing the metal wires 200 under the action of the functional structure, the light transmittance can be greatly increased.

In order to clarify a structure of the thin film sensor in the embodiments of the present disclosure, the thin film sensor in the embodiments of the present disclosure is described below in conjunction with specific exemplary implementations.

In an exemplary implementation, as shown in FIG. 5, the functional structure in the thin film sensor includes a first medium layer 300 disposed between a layer where the metal wires 200 are located and a layer where the base substrate 100 is located. The thin film sensor further includes a planarization layer 500 covering a side of a layer where the metal wires 200 are located away from the base substrate 100. The first medium layer 300 includes a plurality of first main portions 301 arranged in an intersecting way, and orthographic projections of the first main portions 301 on the base substrate 100 overlap those of the metal wires 200 on the base substrate 100 one to one. For example, the first main portions 301 are disposed in one-to-one correspondence with the metal wires 200, and the orthographic projections of the first main portions 301 on the base substrate 100 totally overlap those of the metal wires 200 on the base substrate 100, respectively. That is, a pattern of the first medium layer 300 is the same as that defined by the plurality of metal wires 200. In this case, the planarization layer 500 not only covers the metal wires 200, but also covers sidewalls of the first main portions 301 with a material of the planarization layer 500 which falls in the hollow-out parts. In such thin film sensor structure, a refractive index of the planarization layer 500 is greater than that of the first medium layer 300, that is, the refractive index of the planarization layer 500 is greater than that of the first main portions 301.

With reference to FIG. 5, in the thin film sensor according to the embodiment of the present disclosure, the metal wires 200 are disposed in one-to-one correspondence with the main portions of the first medium layer 300, the first main portions 301 are located below the metal wires 200 (on a side of the metal wires close to the base substrate 100), and the first main portions and the metal wires are all located in the regions where the conductive wires are located; the metal wires 200 are covered with the planarization layer 400 above, and the planarization layer 400 is located in the regions where the conductive wires are located and the hollow-out parts to fill up the hollow-out parts of the thin film sensor, so as to flatten a surface of the thin film sensor. In this case, the sidewalls of the first main portions 301 are in contact with the planarization layer 400. Meanwhile, the refractive index of the first main portions 301 is less than that of the planarization layer 400 in the embodiment of the present disclosure. Thus, in a case where part of light emitted along the preset direction is irradiated to the regions where the conductive wires of the thin film sensor are located, since the refractive index of the first main portions 301 is less than that of the planarization layer 400 and an effect similar to diffraction occurs when light passes through mediums with non-uniform refractive indices, when the light enters the first main portions 301, part of the light is transmitted into the planarization layer 400 with the relatively large refractive index, that is, part of the light bypasses the metal wires 200, enters the hollow-out parts and exits from the hollow-out parts, so that the light is prevented from being irradiated to the metal wires 200 to be directly absorbed or reflected, thereby greatly increasing the light transmittance.

In some exemplary implementations, both of a material of the first medium layer 300 and that of the planarization layer 400 may be an optically transparent organic material or an optically transparent inorganic material. The optically transparent organic material includes, but is not limited to, COP, polyethylene terephthalate (PET), OCA adhesive, optical plastic CR-39, cured PMMA, SUB, AZ5214 and the like; and the optically transparent inorganic material includes, but is not limited to, SiO, $Al_2O_3$, ZnO, SiN and the like. It should be understood that any case where a refractive index of the optically transparent material of the first medium layer 300 is less than that of the optically transparent material of the planarization layer 400 should fall within the scope of the embodiments of the present disclosure.

Figure 6:
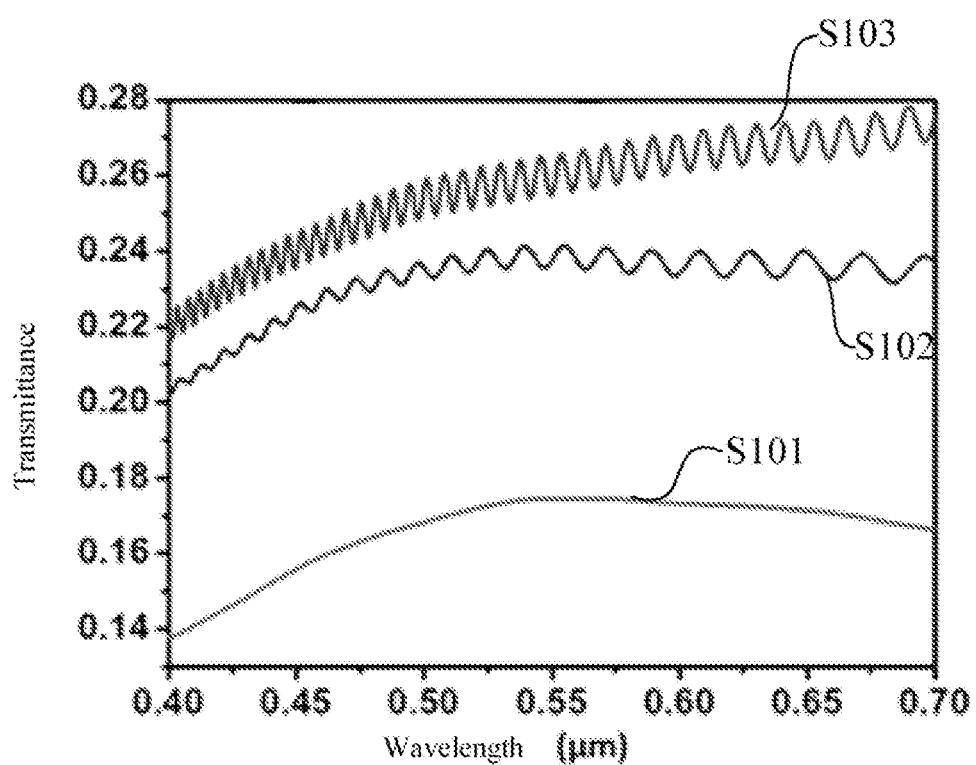
FIG. 6 is a simulation diagram of light transmittance of the thin film sensor of FIG. 5.

With reference to FIG. 5, the first main portion 301 has a first section perpendicular to an extending direction thereof. The first section is rectangular. In order to guarantee a sufficient diffraction propagation distance, the first main portion 301 having the rectangular first section is generally required to have a relatively large thickness. In some exemplary implementations, a height of the first section is at least 1.5 times of a width of the first section, and 2 times or more than 2 times is optional. That is, the thickness of the first main portion 301 is at least 1.5 times of a line width thereof. Within a reasonable range, the greater the thickness of the first main portion 301, the higher the transmittance of the thin film sensor. For example, the metal wire 200 is made of a silver material with a line width of 3 µm and a thickness of 60 nm; the line width of the first main portion 301 is the same as that of the metal wire 200, i.e., 3 µm, and the thickness of the first main portion 301 is set to 6 µm or 11.5 µm; the refractive index of the first main portion 301 is set to 1.53 in a visible light band (in this case, the first main portion 301 is made of COP), and the refractive index of the planarization layer 400 is set to 1.6 in the visible light band (in this case, the planarization layer 400 is made of the OCA adhesive). It can be seen in FIG. 6 that the maximum light transmittance within the width of 3 µm is only 17% (S101 in FIG. 6) because light is blocked by the metal wires 200 with the width of 3 µm. The maximum light transmittance can be increased to approximately 28% (S102 in FIG. 6) through compensation by the first medium layer 300. The magnitude of the transmittance is also closely related to a thickness of the first medium layer 300 (the first main portions 301). As shown in FIG. 6, compared with the first medium layer 300 with the thickness of 6 µm, the first medium layer 300 with the thickness of 11.5 µm is more likely to cause the greater transmittance (S103).

It should be noted that the above description is given by taking a case where the first section of the first main portion 301 is rectangular as an example. In practical products, a shape of the first section of the first main portion 301 is not limited to the rectangle, and may be any shape such as an inverted triangle, an inverted trapezoid, or a semi-ellipse, and those shapes are not listed one by one here.

In view of the above thin film sensor structure, the embodiments of the present disclosure further provides a manufacturing method of a thin film sensor, which includes the following steps S11 to S14.

At step S11, a base substrate 100 is provided.

The base substrate 100 may be a flexible thin film, and a material of the flexible thin film may be at least one of COP, polyimide (PI) or polyethylene terephthalate (PET).

At step S12, a pattern including a first medium layer 300 is formed on the base substrate 100.

Taking a case where the first medium layer 300 is made of an organic curing adhesive which is capable of being cured at a low temperature, in the step S12, a layer of the organic curing adhesive and a layer of a photoresist may be coated on the base substrate 100 first, then processes of exposure, development and etching are performed to remove the organic curing adhesive corresponding to hollow-out parts, and finally the remaining organic curing adhesive is cured at a low temperature, thereby forming the first medium layer 300 having first main portions 301 arranged in an intersecting way.

At step S13, a pattern of metal wires 200 is formed by a patterning process on the base substrate 100 on which the first medium layer 300 is formed.

Specifically, the step S13 may include forming a metal thin film on a side of the first medium layer 300 away from the base substrate 100 by, but not limited to, a sputtering process, coating a photoresist, and then removing metal materials corresponding to the hollow-out parts by processes of exposure, development and etching, thereby forming a plurality of metal wires 200 arranged in an intersecting way.

At step S14, a planarization layer 400 is formed on the base substrate 100 on which the metal wires 200 are formed.

In the step S14, the planarization layer 400 may be deposited through Plasma Enhanced Chemical Vapor Deposition, Low Pressure Chemical Vapor Deposition, Atmospheric Pressure Chemical Vapor Deposition or Electron Cyclotron Resonance Chemical Vapor Deposition.

Thus, manufacturing of the thin film sensor shown in FIG. 5 is completed.

In another exemplary implementation, FIG. 7 to FIG. 10 are schematic cross-sectional diagrams of other structures of the thin film sensor according to an embodiment of the present disclosure. As shown in FIG. 7 to FIG. 10, the functional structure of the thin film sensor includes not only the first medium layer 300 but also a second medium layer 500, and a refractive index of the second medium layer 500 is greater than that of the first medium layer 300. The second medium layer 500 is provided with a plurality of first grooves arranged in an intersecting way; and the first main portions of the first medium layer 300 are disposed in the first grooves, and the first main portions 301 are disposed in one-to-one correspondence with the first grooves, for example, the first main portions 301 are in one-to-one correspondence with the first grooves. The metal wires 200 are located on a side of the first main portions 301 away from the base substrate 100.

Figure 7:
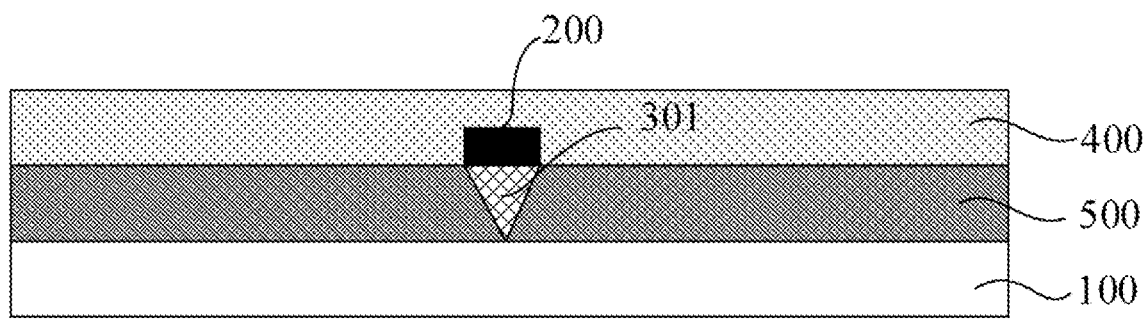
FIG. 7 is a schematic cross-sectional diagram of a structure of a thin film sensor according to an embodiment of the present disclosure.

With reference to FIG. 7, since the first main portions 301 are disposed in the first grooves, the sidewalls of the first main portions 301 are wrapped by the second medium layer 500. In a case where part of the light emitted along the preset direction is irradiated to the regions where the conductive wires of the thin film sensor are located, since the refractive index of the first medium layer 300 is less than that of the second medium layer 500 and an effect similar to diffraction occurs when light passes through the mediums with non-uniform refractive indices, when the light enters the first main portions 301, part of the light is transmitted to the second medium layer 500 with the relatively large refractive index, that is, part of the light bypasses the metal wires 200, enters the hollow-out parts and exits from the hollow-out parts, so that the light is prevented from being irradiated to the metal wires 200 to be directly absorbed or reflected, thereby greatly increasing the light transmittance.

In some exemplary implementations, a material of the first medium layer 300 may be same as that of the first medium layer 300 in the thin film transistor shown in FIG. 5. A material of the second medium layer 500 may be the same in type as that of the first medium layer 300, that is, the material of the second medium layer 500 may be the optically transparent organic material or the optically transparent inorganic material. The optically transparent organic material includes, but is not limited to, COP, PET, OCA adhesive, optical plastic CR-39, cured PMMA, SUB, AZ5214 and the like; and the optically transparent inorganic material includes, but is not limited to, $SiO$, $Al_2O_3$, $ZnO$, SiN and the like. It should be understood that any case where a refractive index of the optically transparent material of the first medium layer 300 is less than that of the optically transparent material of the second medium layer 500 should fall within the scope of the embodiments of the present disclosure.

In some exemplary implementations, the planarization layer 400 is further disposed on the side of the metal wires 200 away from the base substrate 100. A material of the planarization layer 400 may be the same as that of the second medium layer 500, or may be an optically transparent material having a refractive index, a difference between which and the refractive index of the second medium layer 500 is not greater than 0.2.

Figure 8:
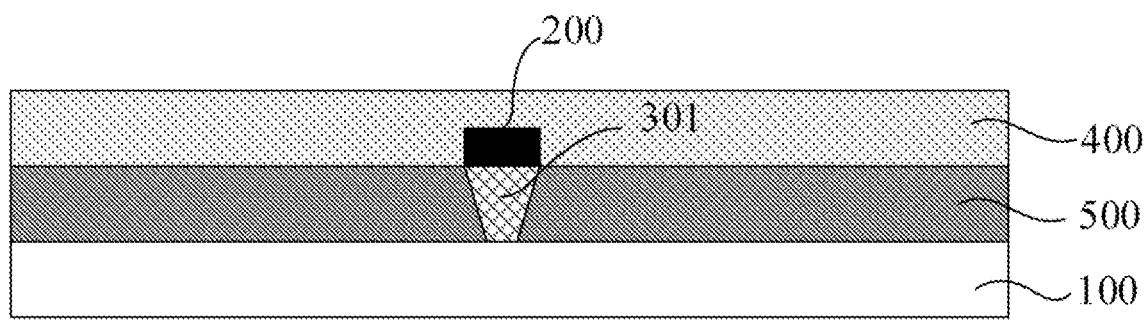
FIG. 8 is a schematic cross-sectional diagram of a structure of a thin film sensor according to an embodiment of the present disclosure.
Figure 9:
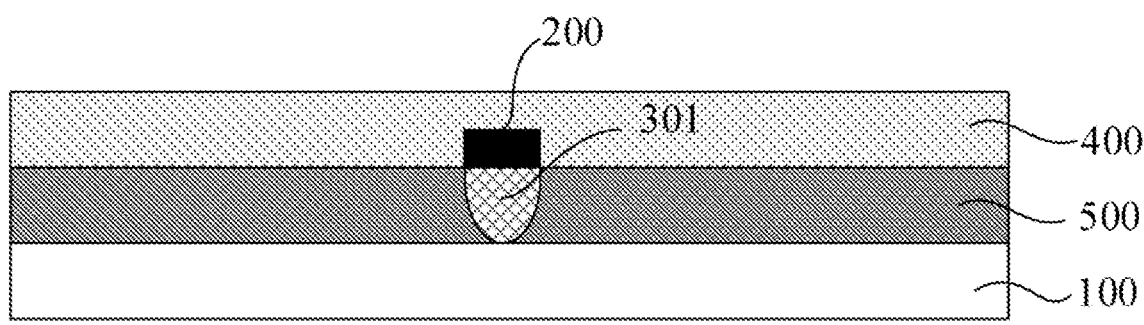
FIG. 9 is a schematic cross-sectional diagram of a structure of a thin film sensor according to an embodiment of the present disclosure.
Figure 10:
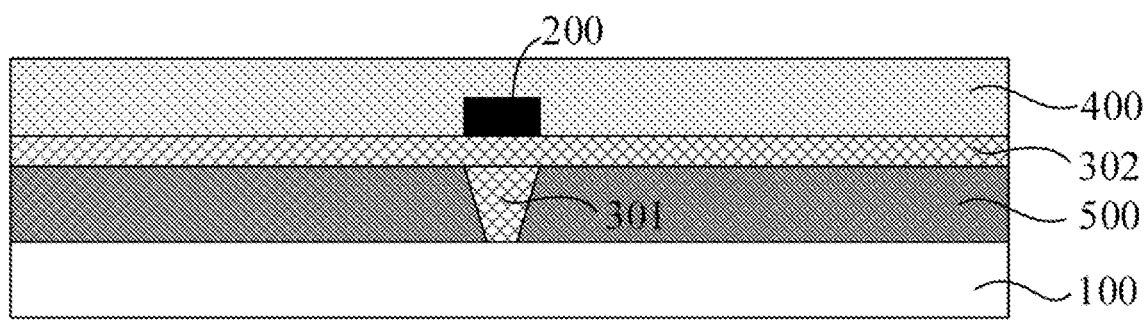
FIG. 10 is a schematic cross-sectional diagram of a structure of a thin film sensor according to an embodiment of the present disclosure.

In some exemplary implementations, the first grooves formed in the second medium layer 500 are usually not in a shape of a rectangle for processing reasons. Correspondingly, the first sections of the first main portions 301 formed in the first medium layer 300 are not rectangular. That is, the first section includes a top edge disposed away from the base substrate 100 and at least one side edge connected to the top edge, with an included angle between a tangent of any point on the side edge and the top edge away from the base substrate 100 being not greater than 90°. Specifically, when the first grooves are inverted triangular grooves, the first sections of the first main portions 301 are inverted triangular accordingly, as shown in FIG. 7. When the first grooves are inverted trapezoidal grooves, the first sections of the first main portions 301 are inverted trapezoidal accordingly, as shown in FIG. 8. When the first grooves are semi-elliptical grooves, the first sections of the first main portions 301 are semi-elliptical accordingly, as shown in FIG. 9. It can be seen that the first main portions 301 and the first grooves are matched with each other. As shown in FIG. 10, when the first main portions 301 are formed, surfaces of the first main portions 301 away from the base substrate 100 are not necessarily flat for processing reasons. Therefore, a flat part 302 is formed by a leveling process on the surfaces of the first main portions 301 away from the base substrate 100, that is, the first medium layer 300 includes not only the first main portions 301 but also the flat part 302 connected with the first main portions 301.

An effect of increasing the transmittance of the thin film sensor by providing the first medium layer 300 and the second medium layer 500 is described by taking the thin film sensor which is provided with the first main portions 301 having the inverted triangular first sections or the inverted trapezoidal first sections as an example.

Figure 11:
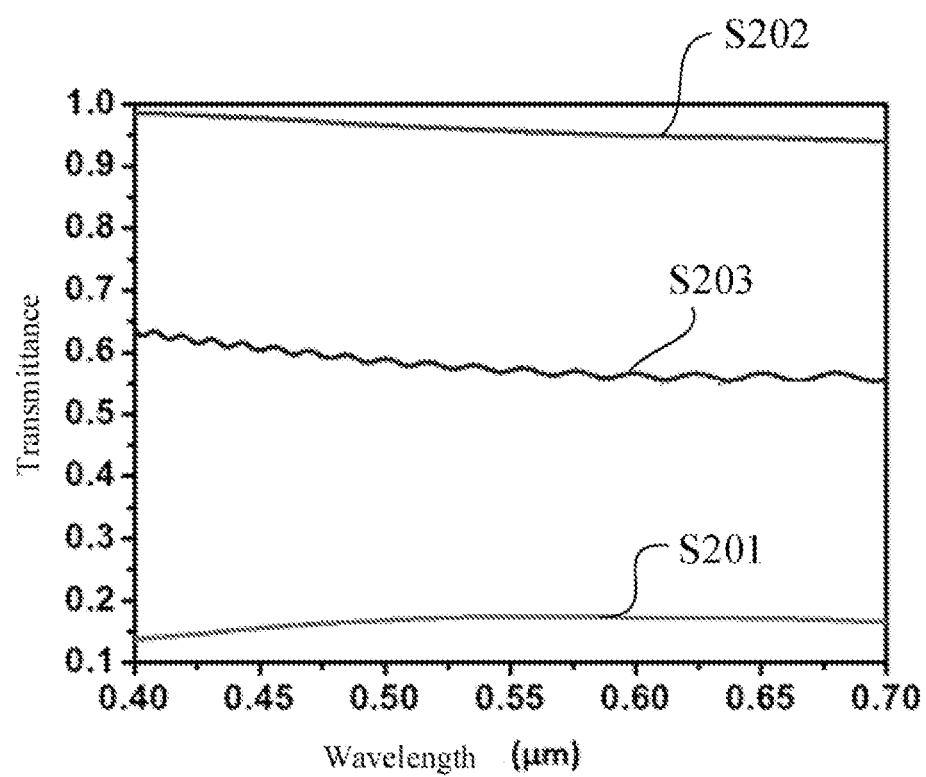
FIG. 11 is a simulation diagram of light transmittance of each of the thin film sensors shown in FIG. 7 and FIG. 8.

When the line width of the metal wire 200 is 3 μm, the line width of the first main portion 301 having the inverted triangular first section is also 3 μm, and a height of the inverted triangular first section is 8 μm, that is, the thickness of the first main portion 301 is 8 μm. When the line width of the metal wire 200 is 3 μm, a line width of a surface of the first main portion 301 having the inverted trapezoidal first section, which is in contact with the metal wire 200, is also 3 μm, a line width of a surface of the first main portion 301 having the inverted trapezoidal first section, which is away from the metal wire 200 is 1 μm, and a height of the inverted trapezoidal first section is 5 μm, that is, the thickness of the first main portion 301 is 5 μm. The refractive index of the first main portion 301 (the first medium layer 300) having the inverted triangular first section or the inverted trapezoidal first section is set to 1.48, and the refractive index of the second medium layer 500 is set to 1.6, that is, a difference between the refractive indices of the first medium layer 300 and the second medium layer 500 is 0.12. As shown in FIG. 11, the light transmittance reaches 90% or more over the entire visible light band through the compensation by the first main portion 301 having the inverted triangular first section (S202 in FIG. 11). The light transmittance is also increased from 17% (S201 in FIG. 11) to 55% or more (S203 in FIG. 11) through the compensation by the first main portion 301 having the inverted trapezoidal first section.

For the thin film sensor provided with the functional structure including the first medium layer 300 and the second medium layer 500, manufacturing methods of a thin film sensor are also provided below. One of the methods can achieve formation of the rectangular first grooves, and the other method can achieve formation of the non-rectangular first grooves. The two methods are respectively described below.

The manufacturing method of the thin film sensor provided with the rectangular first grooves may include the following steps S21 to S24.

At step S21, the base substrate 100 is provided.

The base substrate 100 may be a flexible thin film, and a material of the flexible thin film may be at least one of COP, polyimide (PI) or polyethylene terephthalate (PET).

At step S22, a pattern including the second medium layer 500 is formed by a patterning process on the base substrate 100.

Specifically, the step S22 may include forming a second material layer on the base substrate 100, coating a photoresist on the second material layer, and then exposing, developing, and etching to form the second medium layer 500 having the rectangular first grooves.

At step S23, a pattern including the first medium layer 300 and the metal wires 200 are formed on a side of the second medium layer 500 away from the base substrate 100.

Specifically, the step S23 may include sequentially coating a first material layer and a metal material layer on the side of the second medium layer 500 away from the base substrate 100, with thicknesses of the first material layer and the metal material layer both much less than that of the second material layer, and the first material layer and the metal material layer falling in the first grooves separated from the first material layer and the metal material layer covering the first grooves; and removing the metal material layer outside the first grooves with a strong adhesive tape, thereby forming the metal wires 200 and the first main portions 301 located below the metal wires 200.

At step S24, the planarization layer 400 is formed on the base substrate 100 on which the metal wires 200 are formed.

In the step S24, the planarization layer 400 may be deposited through Plasma Enhanced Chemical Vapor Deposition, Low Pressure Chemical Vapor Deposition, Atmospheric Pressure Chemical Vapor Deposition or Electron Cyclotron Resonance Chemical Vapor Deposition.

Thus, manufacturing of the thin film sensor provided with the rectangular first grooves is completed.

The manufacturing method of the thin film sensor provided with the non-rectangular first grooves may include the following steps S31 to S34. FIG. 10 illustrates an example in which the first grooves are inverted trapezoidal and the first medium layer 300 includes the first main portions 301 and the flat part 302.

At step S31, the base substrate 100 is provided.

The base substrate 100 may be a flexible thin film, and a material of the flexible thin film may be at least one of COP, polyimide (PI) or polyethylene terephthalate (PET).

At step S32, a pattern including the second medium layer 500 is formed by a patterning process on the base substrate 100.

Specifically, the step S32 may include forming a second material layer on the base substrate 100, coating a photoresist on the second material layer, and then exposing, developing, and etching to form the second medium layer 500 having the inverted trapezoidal first grooves.

At step S33, the first medium layer 300 is formed on the side of the second medium layer 500 away from the base substrate 100.

Specifically, the step S33 may include coating a first material layer on the side of the second medium layer 500 away from the base substrate 100, with the first material layer filling the first grooves for forming the first main portions 301 of the first medium layer 300, and the first material layer covering the second medium layer 500 for forming the flat part 302 of the first medium layer 300, thereby forming the first medium layer 300.

At step S34, a pattern including the metal wires 200 is formed by a patterning process on the base substrate 100 on which the first medium layer 300 is formed.

Specifically, the step S34 may include forming a metal thin film on the side of the first medium layer 300 away from the base substrate 100 by, but not limited to, a sputtering process, coating a photoresist, and then removing metal materials corresponding to the hollow-out parts by processes of exposure, development and etching, thereby forming a plurality of metal wires 200 arranged in an intersecting way.

Thus, manufacturing of the thin film sensor is completed.

It should be noted that the manufacturing method may further include a step of forming the planarization layer 400 after the step S34, and the formation step is the same as the above step of forming the planarization layer 400, and thus is not repeated here.

Figure 12:
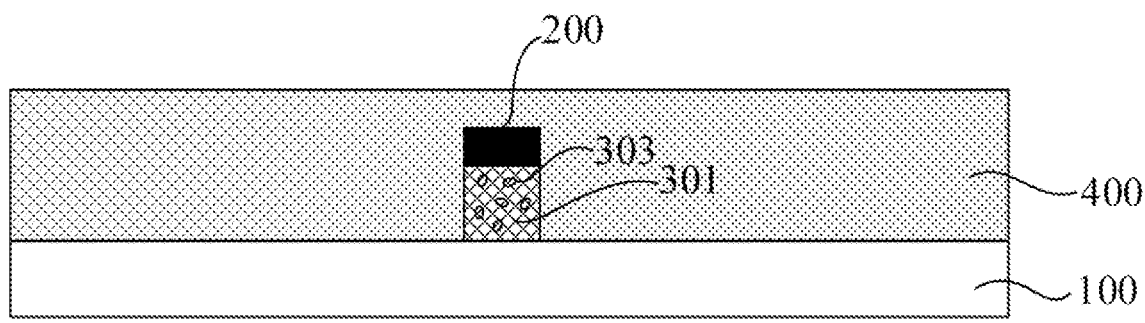
FIG. 12 is a schematic cross-sectional diagram of a structure of a thin film sensor according to an embodiment of the present disclosure.

In another exemplary implementation, FIG. 12 is a schematic cross-sectional diagram of a structure of the thin film sensor according to an embodiment of the present disclosure. The structure of the thin film sensor shown in FIG. 12 is substantially the same as that of the thin film sensor shown in FIG. 5, except that micro-nano scattering particles 304 or micro-nano scattering pores are doped in the first main portions of the first medium layer 300, so as to increase the light transmittance better. The micro-nano scattering particles include, but are not limited to, metal particles or dielectric particles.

Figure 13:
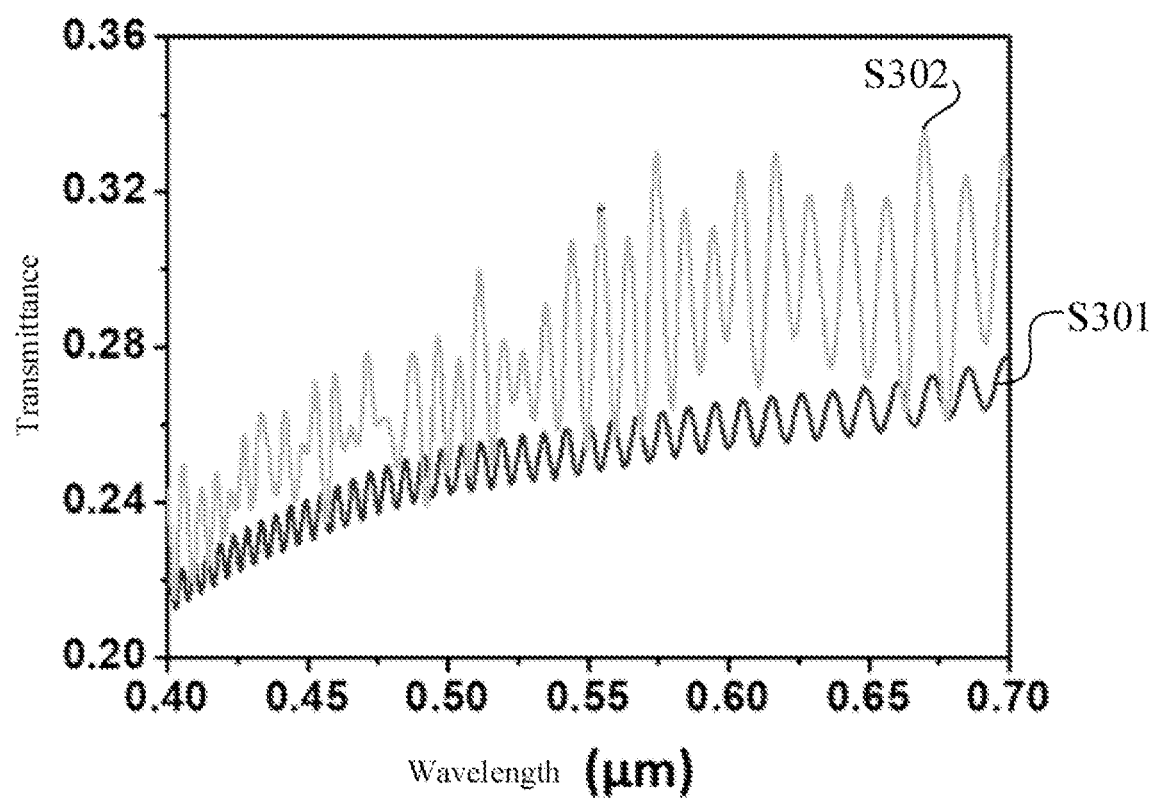
FIG. 13 is a simulation diagram of light transmittance of the thin film sensor of FIG. 12.

With reference to FIG. 12, the line width of the metal wire 200 in the thin film sensor is 3 μm, the line width of the first main portion 301 is also 3 μm, and the thickness of the first main portion 301 is 11 μm. The first main portion 301 is uniformly doped with micro-nano metal scattering particles with diameters of 10 nm to 100 nm, or dielectric nanoparticles with a refractive index greater than that of the first main portion 301, or air pores with a refractive index less than that of the first main portion 301. As shown in FIG. 13, it can be seen that the light transmittance can be increased from 0.17 (S301 in FIG. 13) to 0.27 (S302 in FIG. 13).

In some exemplary implementations, the dielectric nanoparticles having the refractive index greater than that of the first main portion 301 may include titanium dioxide particles, silicon spherical particles and the like. It is also possible to design shapes of the dielectric particles in such a way that resonance of an electric dipole and resonance of a magnetic dipole can be simultaneously excited to generate zero backscattering, so as to further improve optical forward-scattering, thereby increasing the light transmittance. It should be noted that a density of the micro-nano metal particles is required not to be too large when the first main portion 301 is doped with the micro-nano metal particles. This is because metal has a relatively large ohmic loss and can produce a reflection effect, and too many micro-nano metal particles will lead to reflection and absorption of energy instead of forward transmission. Preferably, the diameters of the micro-nano metal particles are from 10 nm to 100 nm, and a concentration of the micro-nano metal particles is about 1 to 2 particles per cubic micrometer.

In addition, the above description is given by taking a case where the first sections of the first main portions 301 are rectangular as an example. Actually, the micro-nano scattering particles or the micro-nano scattering pores can be also doped in the first main portions 301 shown in FIG. 7 to FIG. 10. In all of those cases, the light transmittance can be effectively increased, and those cases are not listed one by one here.

Figure 14:
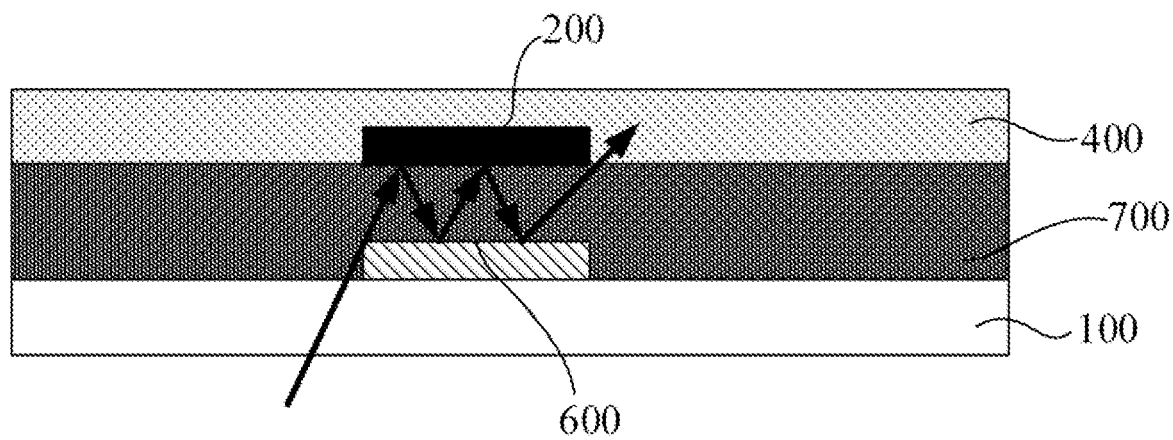
FIG. 14 is a schematic cross-sectional diagram of a structure of a thin film sensor according to an embodiment of the present disclosure.
Figure 15:
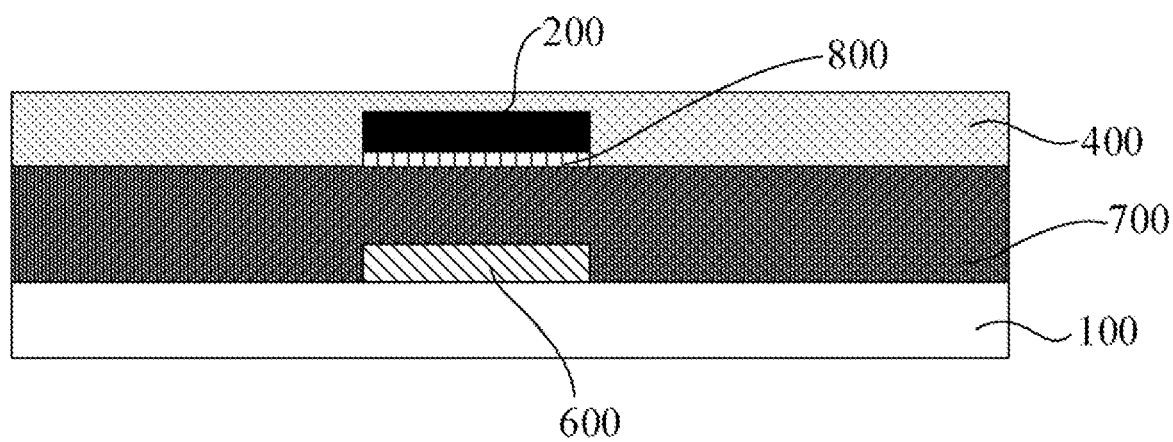
FIG. 15 is a schematic cross-sectional diagram of a structure of a thin film sensor according to an embodiment of the present disclosure.

In another exemplary implementation, FIG. 14 is a schematic cross-sectional diagram of a structure of the thin film sensor according to an embodiment of the present disclosure. As shown in FIG. 14, the functional structure in the thin film sensor includes a third medium layer 600 disposed between the layer where the metal wires 200 are located and the layer where the base substrate 100 is located. The thin film sensor further includes a fourth medium layer 700 disposed between the third medium layer 600 and the metal wires 200. The third medium layer 600 includes a plurality of second main portions arranged in an intersecting way; and an orthographic projection of the second main portions on the base substrate 100 overlap those of the metal wires 200 on the base substrate 100 respectively. For example, the second main portions are disposed in one-to-one correspondence with the metal wires 200, and the orthographic projections of the second main portions on the base substrate 100 overlap those of the corresponding metal wires on the base substrate 100, respectively. The third medium layer 600 is capable of reflecting light, and also has certain light transmittance. Since the third medium layer 600 and the metal wires 200 are disposed opposite to each other and separated from each other by a certain distance, the third medium layer 600 (the second main portions) and the metal wires 200 form optical microcavities. In this case, light entering the optical microcavity is changed in transmission direction under the reflection action of the second main portions and the metal wires 200, and finally bypasses the metal wires 200 and exists from the hollow-out parts.

In some exemplary implementations, an overlapping area of the second main portion with the metal wire 200 is not greater than 10% of an area of the metal wire 200, and better light transmission may be achieved by reasonably setting the overlapping area of the second main portion with the metal wire 200.

In some exemplary implementations, the third medium layer 600 includes, but is not limited to, any one of a metal film, a semi-reflective and semi-transmissive film, and a distributed Bragg reflector (DBR). For example, the third medium layer 600 may be a silver film with a thickness from 10 nm to 40 nm.

In some exemplary implementations, a material of the metal wires 200 includes, but is not limited to, at least one of aluminum, copper, silver and gold. When reflectivity of the metal wires 200 is low, reflective sheets 800 may be formed on a side of the metal wires 200 close to the second main portions, for example, a layer of silver film or a layer of aluminum film is formed as the reflective sheets 800 to enhance the reflectivity of the metal wires 200, so that light can be reflected between the metal wires 200 and the second main portions to be changed in transmission direction, thereby further increasing the light transmittance of the thin film sensor.

In some exemplary implementations, the thin film sensor further includes the planarization layer 400 disposed on the side of the plurality of metal wires 200 away from the base substrate 100; and a difference between refractive indices of the planarization layer 400 and the fourth medium layer 700 is not greater than 0.05. Preferably, the planarization layer 400 is made of a same material as the fourth medium layer 700, so as to ensure that there is no difference between the refractive indices of the fourth medium layer 700 and the planarization layer 400, so that the problem of reduction of optical diffraction efficiency caused by the interface reflection occurring when light leaks from the optical microcavities to the planarization layer 400 is minimized.

For the thin film sensor shown in FIG. 14, the optical microcavfunctions as an anti-reflection layer for light waves in a particular wavelength band. Assuming that energy of incident light is 1, energy obtained after the incident light is transmitted through the metal wires 200 by diffraction is equal to 1-reflectivity-absorpitivity. When the reflectivity is greatly reduced by the optical microcavity, a proportion of the energy obtained after the incident light is transmitted through the metal wires 200 by diffraction can be increased correspondingly. After the optical microcavity is formed, more energy of the incident light is concentrated in the optical microcavity at a resonant wavelength point of visible light, and the incident light passes through the metal wires 200 above through diffraction from left and right openings of the optical microcavity. More electromagnetic energy is directly reflected at a non-resonance point, which reduces probability of diffractive transmission.

Figure 16:
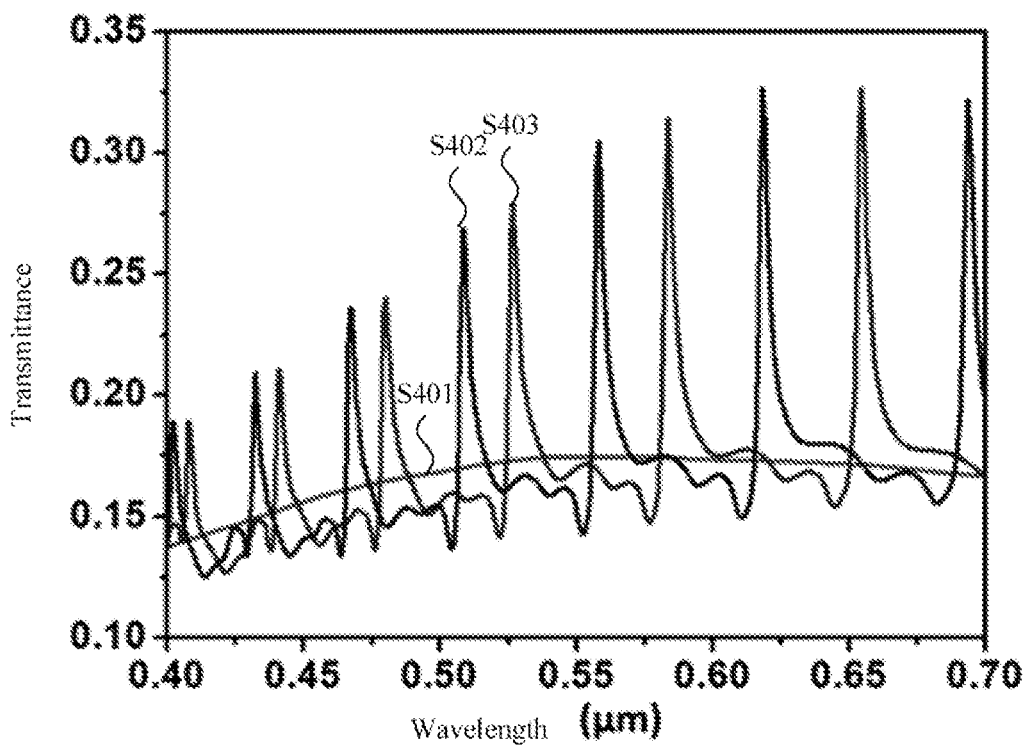
FIG. 16 is a simulation diagram of light transmittance of the thin film sensor shown in FIG. 14.

It should be noted that the larger the thickness of the optical microcavity, the more the wavelength bands where anti-reflection occur; meanwhile, a spectrum of each resonant wavelength band of the optical microcavity is generally narrow, so that a resonant wavelength is very sensitive to the thickness of the optical microcavity, and a change of the thickness by dozens of nanometers can cause a significant shift of a resonant peak. As shown in FIG. 16, when the thickness of the optical microcavity is changed from 1.6 μm to 1.55 μm, and a wavelength of each resonant peak is significantly shifted (S402 is shifted to S403 in FIG. 16). In FIG. 16, the transmittance of the metal wires 200 can be increased from 0.17 (S401 in FIG. 16) to 0.32 (S402 and S403 in FIG. 16) at the resonance wavelength due to an enhanced diffraction effect, that is, the light transmittance is almost doubled. The thickness of the optical microcavity is determined by a thickness of the fourth medium layer 700, so that it is especially important to reasonably set the thickness of the fourth medium layer 700.

Figure 17:
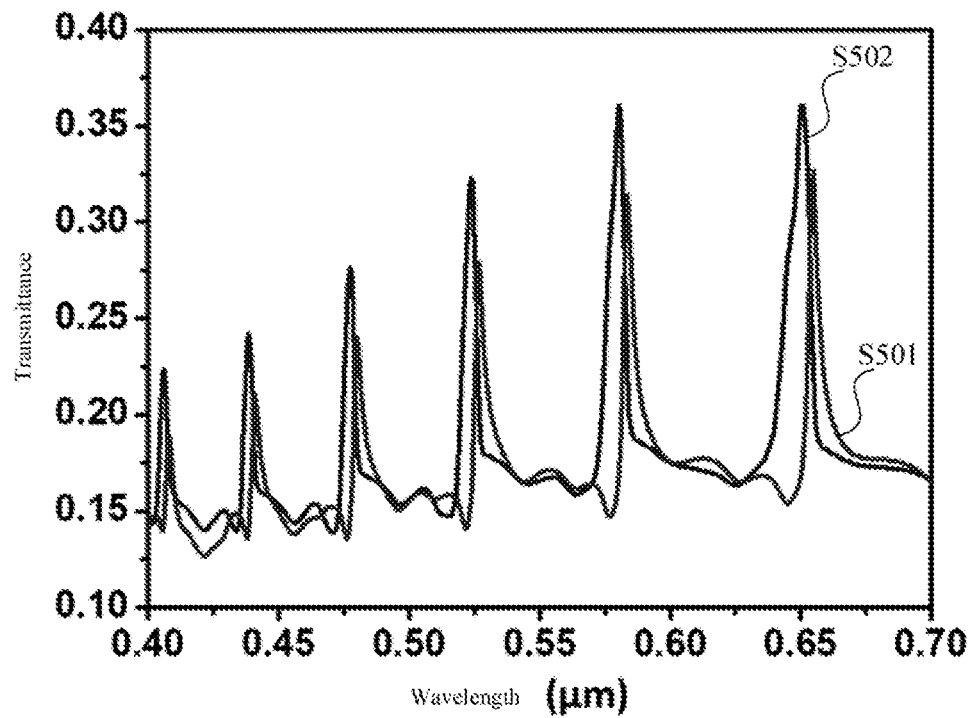
FIG. 17 is a simulation diagram of light transmittance of the thin film sensor of FIG. 14 at different light incident angles.

In addition, the method of compensating for the transmittance of the metal wires 200 with the optical resonance cavity is very sensitive to an incident angle. As can be seen in FIG. 13, when the incident angle is just changed from 0° to 5°, the wavelength of the resonant peak is significantly shifted (S501 is shifted to S502 in FIG. 17). As the incident angle continues to increase, the shift of the wavelength of the resonant peak becomes more significant.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and those modifications and improvements should also fall within the scope of the present disclosure.

What is claimed is:

1. A thin film sensor, comprising:
   a base substrate,
   a plurality of conductive wires on the base substrate, which intersect each other to define a plurality of hollow-out parts; and
   a functional structure on the base substrate; wherein the functional structure is configured to allow at least part of light, which is transmitted along a preset direction and enters the functional structure from regions where the conductive wires are located, to exit from the hollow-out parts, and the preset direction is a direction from the base substrate towards the conductive wires;
   a planarization layer covering a side of the plurality of conductive wires away from the base substrate, wherein
   the functional structure comprises: a first medium layer on a side of the conductive wires close to the base substrate; wherein the first medium layer covers sidewalls of the first medium layer and a refractive index of the first medium layer is less than that of the planarization layer; and
   the first medium layer comprises a plurality of first main portions intersecting each other, wherein an orthographic projection of each first main portion on the base substrate and an orthographic projection of the conductive wire corresponding to the first main portion on the base substrate are the same in shape and coincide.

2. The thin film sensor of claim 1, wherein the functional structure comprises: a first medium layer and a second medium layer on the base substrate; and a refractive index of the first medium layer is less than that of the second medium layer;
   the first medium layer is on a side of the conductive wires close to the base substrate; the first medium layer comprises a plurality of first main portions intersecting each other; and orthographic projections of the first main portions on the base substrate overlap those of the conductive wires on the base substrate one to one; and
   the second medium layer comprises a plurality of first grooves intersecting each other; and the first grooves are filled with the first main portions therein one to one.

3. The thin film sensor of claim 2, wherein the functional structure further comprises a first flat part, which is between the conductive wires and the second medium layer and is connected with the plurality of first main portions to form an integral structure.

4. The thin film sensor of claim 2, further comprising a planarization layer on a side of the plurality of conductive wires away from the base substrate; and a difference between refractive indices of the planarization layer and the second medium layer is not greater than 0.2.

5. The thin film sensor of claim 1, wherein a thickness of each first main portion is at least 1.5 times of a maximum width of the first main portion.

6. The thin film sensor of claim 1, wherein the first main portions are doped with micro-nano scattering particles or micro-nano scattering pores.

7. The thin film sensor of claim 1, wherein each of the first main portions has a first section perpendicular to an extending direction of the first main portion; each of the first sections has a top edge away from the base substrate and at least one side edge connected with the top edge; and an included angle between a tangent of any point on the side edge and the top edge away from the base substrate is not greater than 90°.

8. The thin film sensor of claim 7, wherein a shape of the first section comprises any one of an inverted trapezoid, an inverted triangle, and a semi-ellipse.

9. The thin film sensor of claim 1, wherein the functional structure comprises a third medium layer on the base substrate, and a fourth medium layer between the third medium layer and a layer where the conductive wires are located; and
   the third medium layer comprises a plurality of second main portions intersecting each other wherein an orthographic projection of each second main portion on the base substrate and an orthographic projection of the conductive wire corresponding to the second main portion on the base substrate is the same in shape and coincide.

10. The thin film sensor of claim 9, wherein the second main portions comprise any one of a metal film, a semi-reflective and semi-transmissive film, and a distributed Bragg reflector.

11. The thin film sensor of claim 9, further comprising a planarization layer on a side of the plurality of conductive wires away from the base substrate; and a difference between refractive indices of the planarization layer and the fourth medium layer is not greater than 0.05.

12. The thin film sensor of claim 9, further comprising reflective sheets on a side of the conductive wires opposite to the second main portions.

13. The thin film sensor of claim 2, wherein a thickness of each first main portion is at least 1.5 times of a maximum width of the first main portion.

14. The thin film sensor of claim 2, wherein the first main portions are doped with micro-nano scattering particles or micro-nano scattering pores.

15. The thin film sensor of claim 2, wherein each of the first main portions has a first section perpendicular to an extending direction of the first main portion; each of the first sections has a top edge away from the base substrate and at least one side edge connected with the top edge; and an included angle between a tangent of any point on the side edge and the top edge away from the base substrate is not greater than 90°.

16. The thin film sensor of claim 15, wherein a shape of the first section comprises any one of an inverted trapezoid, an inverted triangle, and a semi-ellipse.

17. A manufacturing method of a thin film sensor, comprising:
forming a plurality of conductive wires intersecting each other and a functional structure on a base substrate; wherein the functional structure is configured to allow at least part of light, which is transmitted along a preset direction and enters the functional structure from regions where the conductive wires are located, to exit from hollow-out parts defined by the conductive wires, and the preset direction is a direction from the base substrate towards the conductive wires, wherein the functional structure comprises a first medium layer disposed on the base substrate, the forming the functional structure comprises forming the first medium layer on the base substrate, and the forming the first medium layer comprises:

forming a plurality of first main portions intersecting each other on a side of the conductive wires close to the base substrate, with an orthographic projection of each first main portion on the base substrate and an orthographic projection of the conductive wire to be formed and corresponding to the first main portion on the base substrate are the same in shape and coincide; and the manufacturing method further comprises:

forming a pattern comprising a planarization layer on a side of the first medium layer away from the base substrate, wherein the first medium layer covers sidewalls of the first medium layer and a refractive index of the first medium layer is less than that of the planarization layer.

18. A manufacturing method of a thin film sensor, comprising:
forming a plurality of conductive wires intersecting each other and a functional structure on a base substrate; wherein the functional structure is configured to allow at least part of light, which is transmitted along a preset direction and enters the functional structure from regions where the conductive wires are located, to exit from hollow-out parts defined by the conductive wires, and the preset direction is a direction from the base substrate towards the conductive wires, wherein the functional structure comprises: a first medium layer and a second medium layer on the base substrate; a refractive index of the first medium layer is less than that of the second medium layer; and the forming the functional structure comprises:

forming the second medium layer on a side of the conductive wires close to the base substrate, wherein a plurality of first grooves intersecting each other are formed in the second medium layer; and forming the first medium layer, which comprises a plurality of first main portions intersecting each other, between the second medium layer and the conductive wires, wherein an orthographic projection of each first main portion on the base substrate and an orthographic projection of the conductive wire corresponding to the first main portion on the base substrate is the same in shape and coincide.

* * * * *